US012717995B2

(12) United States Patent
Briggs

(10) Patent No.: US 12,717,995 B2
(45) Date of Patent: Aug. 25, 2026

(54) STRUCTURE AND TECHNIQUE OF PHOTO-DEFINED SEMICONDUCTOR DEVICE WITH SELECTIVE DIELECTRIC CONSTANT REDUCTION

(71) Applicant: Applied Materials, Inc., Santa Clara, CA (US)

(72) Inventor: Benjamin D. Briggs, Merrimack, NH (US)

(73) Assignee: Applied Materials, Inc., Santa Clara, CA (US)

( * ) Notice: Subject to any disclaimer, the term of this patent is extended or adjusted under 35 U.S.C. 154(b) by 360 days.

(21) Appl. No.: 18/482,544

(22) Filed: Oct. 6, 2023

(65) Prior Publication Data

US 2025/0117561 A1 Apr. 10, 2025

(51) Int. Cl.

| | |
|---|---|
| ***G06F 30/392*** | (2020.01) |
| ***G03F 7/00*** | (2006.01) |
| ***H10W 70/05*** | (2026.01) |
| ***H10W 70/60*** | (2026.01) |
| *H10W 70/09* | (2026.01) |
| *H10W 70/69* | (2026.01) |

(52) U.S. Cl.

CPC ........ *G06F 30/392* (2020.01); *G03F 7/70375* (2013.01); *G03F 7/70508* (2013.01); *H10W 70/05* (2026.01); *H10W 70/60* (2026.01); *H10W 70/611* (2026.01); *H10W 70/09* (2026.01); *H10W 70/69* (2026.01)

(58) Field of Classification Search

CPC .. G06F 30/392; H10W 70/05; G03F 7/70375; G03F 7/70508

See application file for complete search history.

(56) References Cited

U.S. PATENT DOCUMENTS

| | | | | |
|---|---|---|---|---|
| 8,786,105 | B1 | 7/2014 | Meyer et al. | |
| 2009/0061201 | A1* | 3/2009 | Chen | C23C 16/401 427/9 |
| 2016/0147928 | A1* | 5/2016 | Ho | G06F 30/398 716/122 |
| 2018/0047653 | A1 | 2/2018 | Costa et al. | |
| 2018/0173835 | A1* | 6/2018 | Do | G03F 1/70 |

(Continued)

FOREIGN PATENT DOCUMENTS

| | | | |
|---|---|---|---|
| TW | 202312361 | A | 3/2023 |

OTHER PUBLICATIONS

Taiwanese Application No. 113134053, Office Action mailed on Aug. 7, 2025, 6 pages.

(Continued)

*Primary Examiner* — Michael Jung

(74) *Attorney, Agent, or Firm* — Kilpatrick Townsend & Stockton LLP

(57) ABSTRACT

A semiconductor device may include a substrate. The semiconductor device may also include a dielectric material characterized, at least in part, by a dielectric constant. The semiconductor device may include a metallic pathway formed in the dielectric material. The semiconductor device may include a region about the metallic pathway of the semiconductor device may include a plurality of air gaps within the dielectric material and arranged three-dimensionally throughout the region, where the region may include a lower dielectric constant than the dielectric constant of the dielectric material.

19 Claims, 7 Drawing Sheets

(56) References Cited

U.S. PATENT DOCUMENTS

| | | | | |
|---|---|---|---|---|
| 2019/0278005 | A1* | 9/2019 | Young | G02B 5/1842 |
| 2019/0348747 | A1 | 11/2019 | Liu et al. | |
| 2020/0066729 | A1 | 2/2020 | Simsek-Ege et al. | |
| 2020/0286825 | A1 | 9/2020 | Hwang et al. | |
| 2021/0202334 | A1* | 7/2021 | Suo | H10W 74/129 |
| 2023/0369211 | A1* | 11/2023 | Engel | H10W 20/435 |
| 2025/0192056 | A1* | 6/2025 | Su | H10W 20/098 |

OTHER PUBLICATIONS

PCT/US2024/044043, “International Search Report and Written Opinion”, Dec. 5, 2024, 9 pages.

* cited by examiner

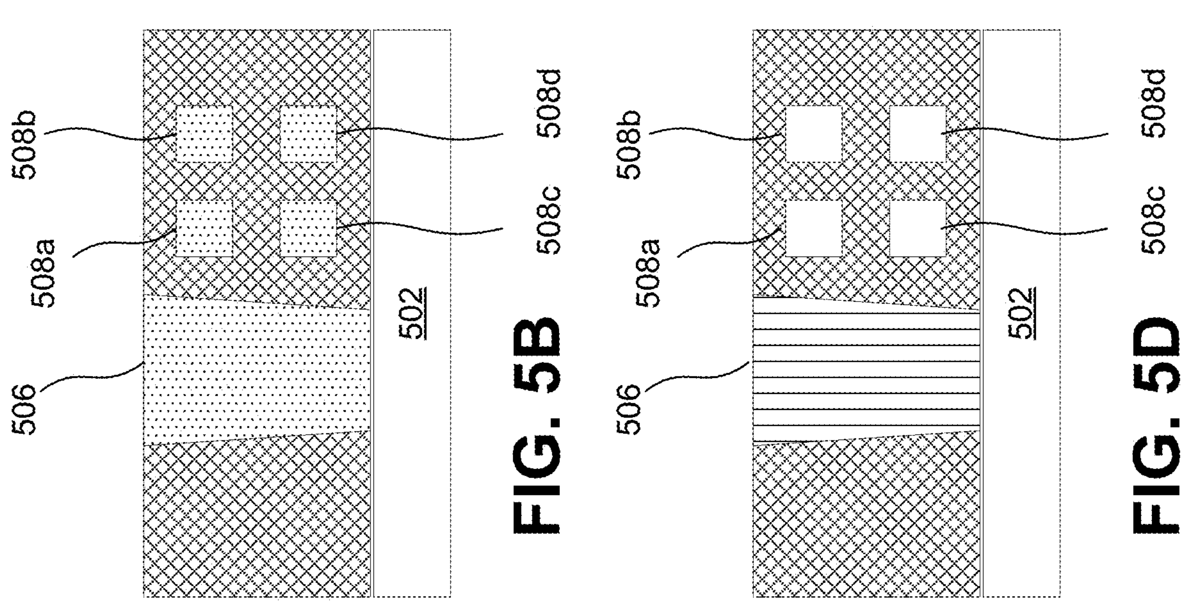
506
508a
508b
508c
508d
502
FIG. 5B
506
508a
508b
508c
508d
502
FIG. 5D
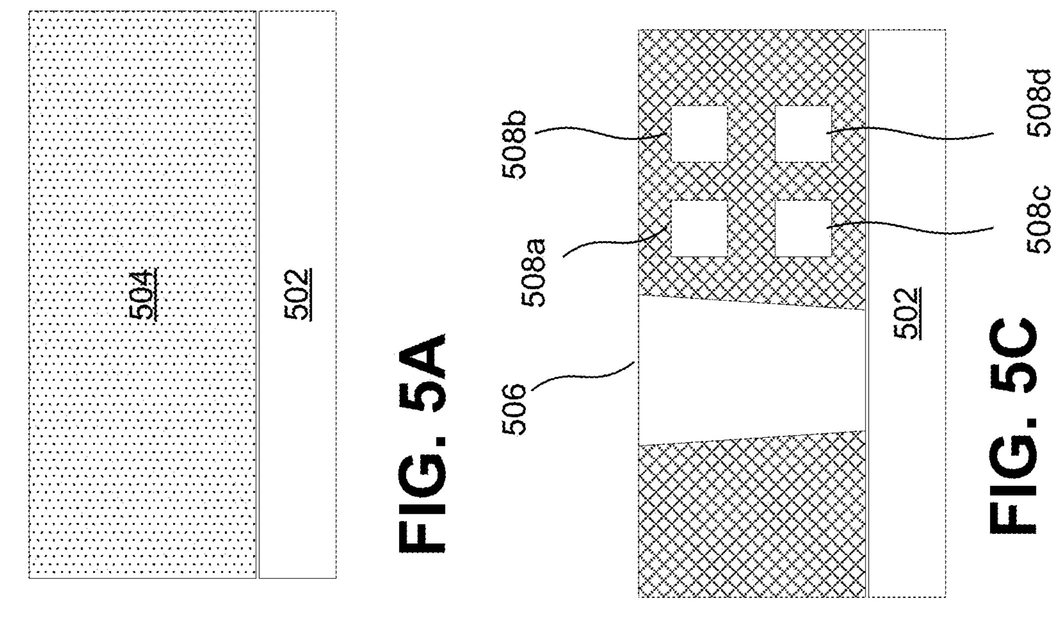
500
504
502
FIG. 5A
506
508a
508b
508c
508d
502
FIG. 5C

STRUCTURE AND TECHNIQUE OF PHOTO-DEFINED SEMICONDUCTOR DEVICE WITH SELECTIVE DIELECTRIC CONSTANT REDUCTION

TECHNICAL FIELD

This disclosure generally relates to lithography systems. More specifically, this disclosure relates to forming semiconductor devices with varying dielectric constants.

BACKGROUND

As the pitch between structures on a semiconductor device shrink, interference between the structures may increase. For example, vias (or pathways, lines, etc) may shrink in order to increase and input/output (I/O) count on a semiconductor device. As the vias shrink, the capactiance of the vias increase. Also, because the vias shrink in physical size, the resistance may increase. The increase in resistance and capacitance (RC) values may degrade performance of the vias. In some semiconductor devices where temperature is not a limiting factor in manufacturing, materials used in the manufacturing process may be varied to alter the dielectric constant and overcome the increases in RC values. In temperature-sensitive devices, however, other techniques and systems may be required.

SUMMARY

A method of constructing a redistribution layer of a semiconductor device may include identifying, by a computing device, a three-dimensional region of the semiconductor device where a pathway may be formed. The material to be used to manufacture the semiconductor device may include a dielectric constant, and a desired signal integrity along the pathway may require a lower dielectric constant. The method may include generating, by the computing device, a deposition plan characterized by air gaps formed in the three-dimensional region of the semiconductor device where the pathway may be formed. The method may include determining, by the computing device, that the deposition plan at least meets mechanical properties limits associated with the three-dimensional region of the semiconductor device. In response to determining that the deposition plan at least meets the mechanical properties limits associated with the three-dimensional region of the semiconductor device, the method may also include providing, by the computing device, the deposition plan to a semiconductor processing system such that the semiconductor processing system executes the deposition plan and forms the semiconductor device may include the pathway through the three-dimensional region, the three-dimensional region characterized by the lower dielectric constant such that the desired signal integrity is achieved.

In some embodiments, the semiconductor processing system is configured to produce a semiconductor device using 2-photon lithography. In some embodiments, the semiconductor device may include an advanced packaging device. The pathway may be formed using a copper damascene process. The air gaps of the three-dimensional region and the material of the three-dimensional region may form a lattice pattern characterized by at least one of cubic air gaps, hexagonally prismatic air gaps, and pyramidic air gaps. The mechanical properties of the three-dimensional region may be determined, at least in part, by a required mechanical strength of the three-dimensional region. The mechanical properties of the three-dimensional region may include a thermal tolerance of the three-dimensional region. The three-dimensional region may be identified at least in part by determining properties of a second semiconductor device to be formed above the three-dimensional region and determining properties of a third semiconductor device to be formed below the three-dimensional region. The deposition plan may be generated in part by calculating a total capacitance of the three-dimensional region may include the air gaps.

A system may include a semiconductor processing chamber, configured to receive a substrate. The system may include a lithography tool configured to perform 2-photon lithography. The system may include a computing device may also include one or more processors and a non-transitory computer-readable medium including instructions. When executed by the one or more processors the computing device to perform operations. According to the operations, the computing system may identify a three-dimensional region of a semiconductor device where a pathway may be formed, where a material to be used to manufacture the semiconductor device includes a dielectric constant, and a desired signal integrity along the pathway requires a lower dielectric constant. The computing system may generate a deposition plan characterized by air gaps formed in the three-dimensional region of the semiconductor device where the pathway may be formed. The computing system may determine that the deposition plan at least meets mechanical properties limits associated with the three-dimensional region of the semiconductor device. In response to determining that the deposition plan at least meets the mechanical properties limits associated with the three-dimensional region of the semiconductor device, the computing system may provide the deposition plan to a semiconductor processing system such that the semiconductor processing system executes the deposition plan and forms the semiconductor device may include the pathway through the three-dimensional region, the three-dimensional region characterized by the lower dielectric constant such that the desired signal integrity is achieved.

In some embodiments, the deposition plan may be generated at least in part using a chip package interaction analysis. Identifying the three-dimensional region may include a context-aware analysis, where system requirements of a plurality of structures may include on the semiconductor device are used to identify the three-dimensional region. The context aware analysis may include determining properties of a second semiconductor device to be formed above the three-dimensional region and determining properties of a third semiconductor device to be formed below the three-dimensional region. The air gaps of the three-dimensional region and the material of the region may form a lattice pattern characterized by at least one of cubic air gaps, hexagonally prismatic air gaps, and pyramidic air gaps.

A semiconductor device may include a substrate. The semiconductor device may also include a dielectric material characterized, at least in part, by a dielectric constant. The semiconductor device may include a metallic pathway formed in the dielectric material. The semiconductor device may include a region about the metallic pathway of the semiconductor device may include a plurality of air gaps within the dielectric material and arranged three-dimensionally throughout the region, where the region may include a lower dielectric constant than the dielectric constant of the dielectric material.

In some embodiments, an adjacent region of the semiconductor device may be characterized by a lack of air gaps. A position of the metallic pathway may be determined according to length-matching requirements associated with a corresponding metallic pathway. The second plurality of air gaps may be configured such that a dielectric constant of the second region modifies a signal integrity of the second metallic pathway to correspond to a signal integrity of the metallic pathway. The semiconductor device may include a redistribution layer. Each air gap of the plurality of air gaps may include dimensions within a range of 100 nanometers to 1 micrometer, inclusive.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

FIGS. 5A-5D illustrate a process flow for manufacturing a semiconductor device with a selectively reduced dielectric constant, according to certain embodiments.

DETAILED DESCRIPTION

Figure 1:
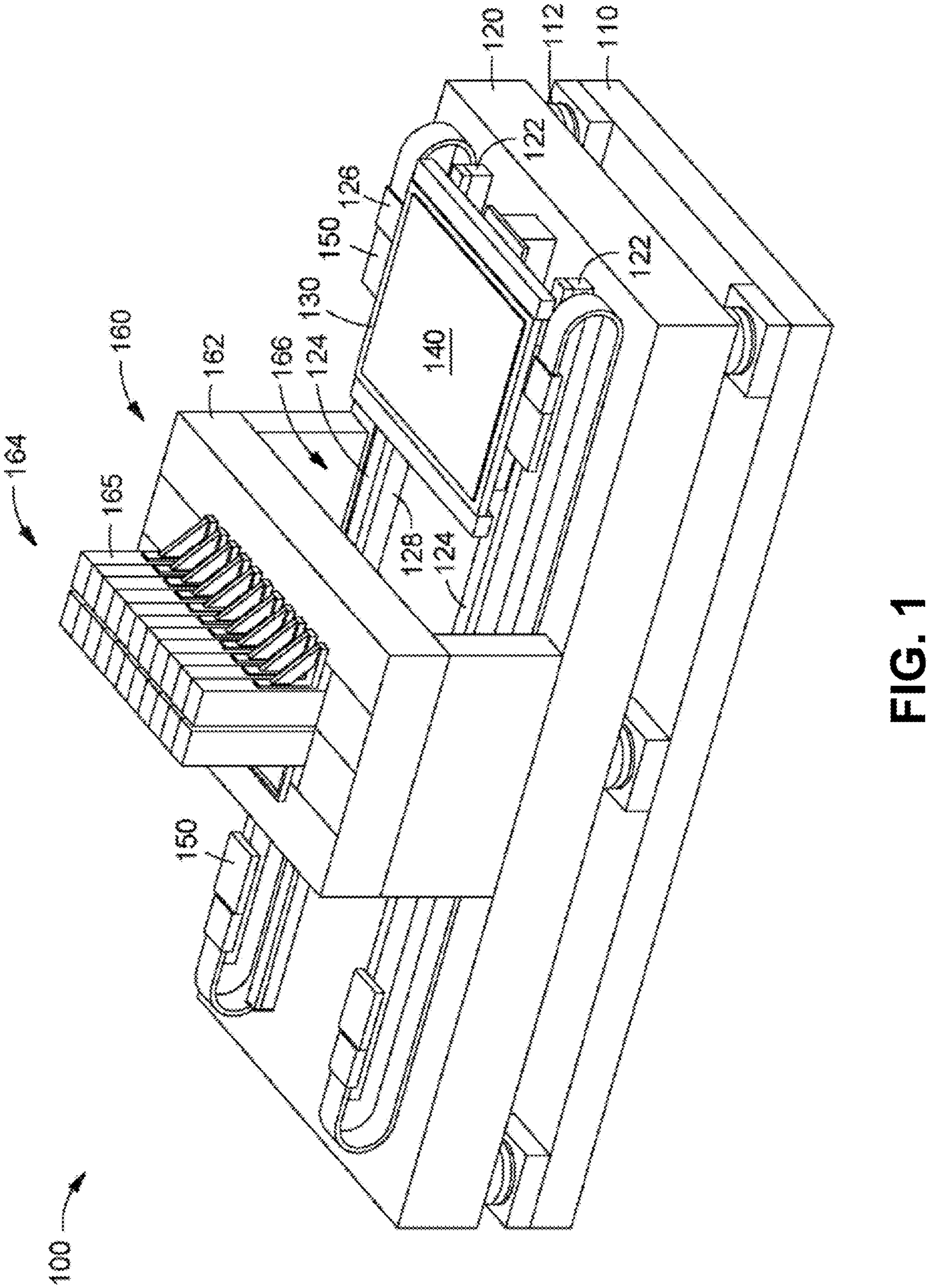
FIG. 1 is a perspective view of a lithography system, according to some embodiments.

A package may include two or more semiconductor devices constructed or assembled together. A redistribution layer (RDL) may connect the semiconductor devices of the package by providing connections, or vias, between various structures of each of the semiconductor devices. As semiconductor manufacturing techniques improve, the size of structures within a semiconductor device tend to get smaller. The pitch between the structures also tends to get smaller. The RDL is no exception: as more semiconductor devices are included on each layer of a package, an amount of vias on an RDL also increases. Physical space within the RDL is limited however, so the pitch of the vias within the RDL may decrease. As the pitch decreases, the tunability of various materials within a semiconductor becomes impractical to modify on the scales necessitated by the smaller pitch.

For example, a first signal may be sent in conjunction with a second signal through two different vias, where the second signal is out of phase with the first signal (e.g., 180° out of phase, or opposite). To read the data included in the first and second signals, a device may need to receive both signals at the same time. While one via (e.g., the first via) may be a straight shot, the other via may need to be routed on a longer path. Because the two vias are of different length, the time-of-flight (TOF) of the two signals may be different. If the TOF of the two signals varies too much, the receiving device may misinterpret the data included in the two signals. To balance the TOF of both signals, the path of the first via may be lengthened to ensure that the two signals arrive at the device at the same time. However, as RDLs become more crowded with vias and other structures, such routing may become overly complicated in both design and manufacturing.

One solution may be to manipulate characteristics of the via to electrically shorten the second via to match the TOF of the first via. The "velocity" of a signal transmitted through a via is governed, in part, by the resistance and capacitance factors (RC factor) of the material(s) through which the signal propagates. The RC factor, in turn, is governed in part by the dielectric constant (k) of the material(s). One way to manipulate the RC factor along the via may be to utilize a different material. For example, a via may run through a material typically used to manufacture semiconductor devices. The material may include polyimide, SiO2, SiN, SiCN, SiCOH, SiCO, and/or other suitable materials. The material may typically be polymer-based, where polymer changes are used to increase or decrease the dielectric constant of the material. However, with larger and larger multichip modules (e.g., packages), the mechanical properties of the polymer changes may prevent the dielectric constant to be lowered sufficiently to achieve the desired performance.

Another solution may be to alter the density of the material. For example, during the design phase, of a semiconductor device, a via may be identified that requires a lower RC factor than that of the material used to manufacture the semiconductor device. A region around the via may then be identified, along with a specific RC factor that would allow a signal passing through the via to perform as desired (e.g., match the TOF to a corresponding via used in differential signaling). Then, a deposition plan may be generated for the semiconductor device, where the dielectric constant of the region around the via is lowered by creating air gaps within the region. Because the region includes air gaps (and thus, less material), the material in the region may be weaker than unmodified regions. The deposition plan may then be verified against mechanical properties limits of the whole semiconductor device to ensure that the modified region will not lead to mechanical failure of the semiconductor device. Then, the semiconductor device may be manufactured according to the deposition plan to include the via and the region with the air gaps.

By altering the density of the material using the air gaps, the effective dielectric constant of the material around the via may be lowered. Thus, the velocity of the signal traveling through the via may also be lowered. By using a lithography technique such as 2-photon lithography, the region may be manufactured in three-dimensions with resolution on a scale of 100 nm to 500 nm, inclusive. Due to the resolution, select regions of an RDL immediately surrounding the via may be tuned, instead of an entire layer or plane within the layer. Therefore, the performance of the via may be selectively tuned without affecting the performance of other regions within the RDL. The systems and methods described herein may provide for the selective dielectric constant reduction within a semiconductor device, leading to better performance of the semiconductor device.

FIG. 1 is a perspective view of a lithography system 100, according to some embodiments. The system 100 includes a base frame 110, a slab 120, a stage 130, and a processing apparatus 160. The system 100 may be configured to perform 2-photon lithography techniques. The base frame 110 rests on the floor of a fabrication facility and supports the slab 120. Passive air isolators 112 are positioned between the base frame 110 and the slab 120. In some embodiments, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140) from the stage 130.

The substrate 140 comprises any suitable material, for example, quartz used as part of a flat panel display. In other embodiments, the substrate 140 is made of other materials. In some embodiments, the substrate 140 has a photoresist layer formed thereon. A photoresist is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. In this manner, the pattern is created on a surface of the substrate 140 to form the electronic circuitry.

The system 100 includes a pair of supports 122 and a pair of tracks 124. The pair of supports 122 are disposed on the slab 120, and the slab 120 and the pair of supports 122 are a single piece of material. The pair of tracks 124 is supported by the pair of the supports 122, and the stage 130 moves along the tracks 124 in the X-direction. In one embodiment, the pair of tracks 124 is a pair of parallel magnetic channels. As shown, each track 124 of the pair of tracks 124 is linear. In other embodiments, one or more track 124 is non-linear. An encoder 126 is coupled to the stage 130 in order to provide location information to a controller (not shown).

The processing apparatus 160 includes a support 162 and a processing unit 164. The support 162 is disposed on the slab 120 and includes an opening 166 for the stage 130 to pass under the processing unit 164. The processing unit 164 is supported by the support 162. In some embodiments, the processing unit 164 is a pattern generator configured to expose a photoresist in a lithography process. In some embodiments, the pattern generator is configured to perform a maskless lithography process. The processing unit 164 includes a plurality of image projection apparatus (shown in FIGS. 2). In some embodiments, the processing unit 164 contains as many as 84 image projection apparatus. Each image projection apparatus is disposed in a case 165. The processing apparatus 160 is useful to perform maskless direct patterning.

During operation, the stage 130 moves in the X-direction from a loading position, as shown in FIG. 1, to a processing position. The processing position is one or more positions of the stage 130 as the stage 130 passes under the processing unit 164. During operation, the stage 130 is be lifted by a plurality of air bearings (not shown) and moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real time so that each of the plurality of image projection apparatus can accurately locate the patterns being written in a photoresist covered substrate. The metrology system also provides a real-time measurement of the angular position of each of the stage 130 about the vertical or Z-axis. The angular position measurement can be used to hold the angular position constant during scanning by means of a servo mechanism or it can be used to apply corrections to the positions of the patterns being written on the substrate 140 by an image projection apparatus.

Figure 2:
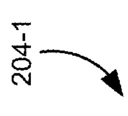
FIG. 2 illustrates a cross-sectional view of a package, according to some embodiments.
Figure 2:
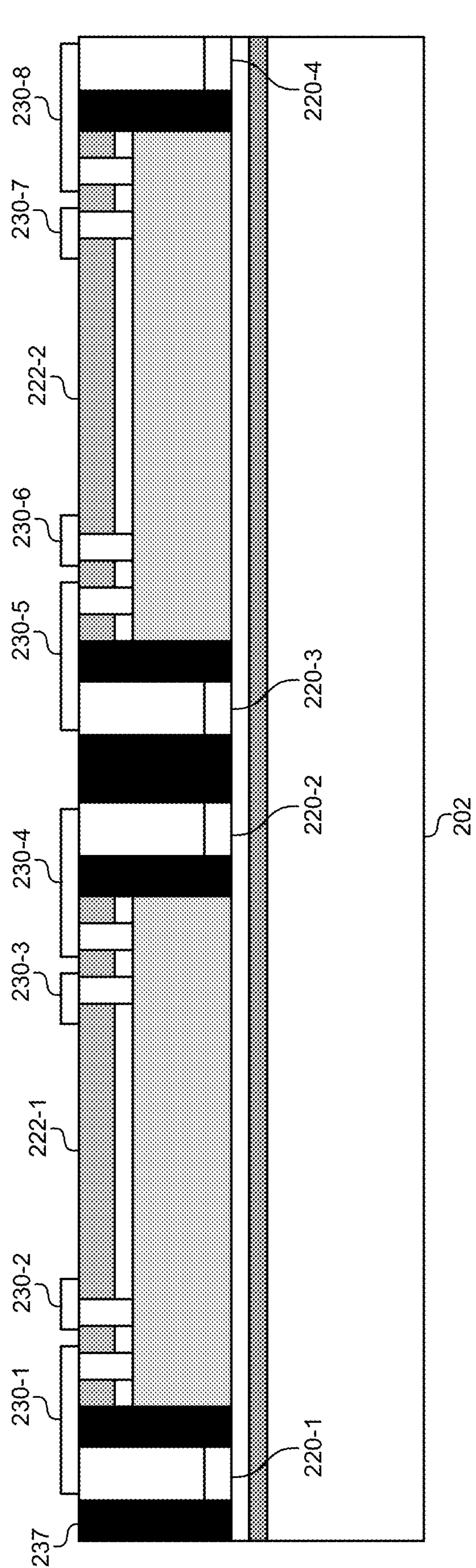

FIG. 2 illustrates a cross-sectional view of a package 204-1, according to some embodiments. The package may be formed on the substrate 202, which may alternatively be referred to as a carrier when the substrate 202 is separated into individual packages. The pillars 220) may be formed from standard semiconductor fabrication processes. For example, a mask layer may be formed with voids where the pillars 220 will be located, and a deposition process may then be used to deposit a metal layer into these voids to form the pillars 220. The mask layer may then be removed to leave the pillars 220 exposed. Because the fabrication process for the pillars 220 may use existing deposition and etch processes that are very accurate, the location of the pillars 220) may often be assumed to be correctly located. Therefore, as described above, the pillars 220 may be used as alignment features for the package 204-1 in some embodiments.

The dies 222 are typically not fabricated directly on the substrate 202 like the pillars 220. Instead, the dies 222 may be fabricated using other semiconductor processes and later adhered to the substrate 202. For example, some embodiments may first deposit a layer of epoxy or other adhesive above the substrate 202, and the dies 222 may be placed in the epoxy at a predetermined location based on the design of the package 204-1. In contrast to the very accurate placement of the pillars 220 using deposition and etch processes in semiconductor fabrication chambers, the physical placement of the dies 222 may be subject to larger variations in the final location after the epoxy has cured. For example, a pick-and-place machine may place the dies 222 at locations on the package 204-1. However, the physical tolerances of both the machinery and the substrate 202 may produce an error in the locations where the dies 222 are physically placed. Even if the dies 222 are placed in exactly the correct position on the package 204-1, the relatively high viscosity of the epoxy may allow the dies 222 to move after they are placed.

The difference between the expected locations of the dies 222 from the design and the actual physical locations of the dies 222 after physical placement during fabrication may negatively affect the accuracy with which the dies 222 may be interconnected on the package 204-1. For example, some embodiments may fill any voids on the package 204-1 with a conformal coating or epoxy to protect the individual components. This coating may be polished down to expose the surfaces of the pillars 220, the input/output (I/O) pads on the dies 222, and/or any other connection surfaces that are part of the package 204-1. In some embodiments, the substrate 202 may be placed in a digital lithography system 100 and the digital lithography techniques described above may be used to deposit traces 230 of metal and other features on the surface of the package 204-1 to form the interconnects of the package 204-1. If the dies 222 are not in the expected position, this very precise routing of the traces 230 formed by the digital lithography techniques may miss the intended I/O pads on the dies 222, which may render the package 204-1 inoperable and thereby lower the effective yield of the semiconductor process.

Figure 3:
FIG. 3 illustrates a semiconductor device with a modified region, according to certain embodiments.
Figure 3:
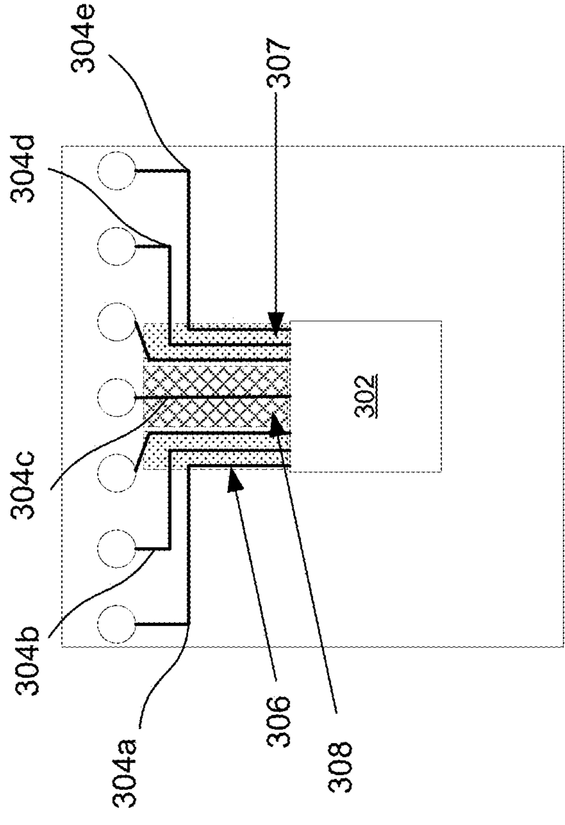

FIG. 3 illustrates a semiconductor device 300 with a modified region 308, according to certain embodiments. The semiconductor device 300 may be manufactured, at least in part using 2-photon lithography, executed by a digital lithography system such as the system 100 in FIG. 1. The semiconductor device 300 may also be similar to some or all of the package 204-1 in FIG. 2. The semiconductor device 300 may include a chip 302, vias 304*a-e*, unmodified regions 306 and 307, and the modified region 308. The vias 304*a-e* may include a metallic pathway, connecting the chip 302 to one or more other structures. The other structures may include pillars, I/O pads, or any other such structure. The unmodified regions 306-307 and modified region 308 may include a negative-tone photosensitive polyimide (n-PSPI), as described above in relation to FIG. 1.

Furthermore, the modified region 308 and/or the unmodified regions 306 and 307 may be three-dimensional regions. For example, the modified region 308 may extend along the length of the via 304*c* and some distance horizontally from the sides of the via 304*c* (as shown in FIG. 3). The modified region 308 may also extend above and below the via 304*c* (e.g., into the page or out of the page, as shown in FIG. 3). accounting for requirements of devices above and below the system 300 (e.g., included in a package such as the package 204-1 in FIG. 2).

The via 304*c* may be identified as a via that requires a lower dielectric constant than the other vias 304*a-b* and 304*d-e* as part of a design process for the semiconductor device 300. For example, the via 304*c* may be used in conjunction with some other via in order to provide differential signaling from the chip 302 to another chip or device. In order to match the TOF of the via 304*c* to that of the other via, a dielectric constant first be determined such that the TOF of the via 304*c* matches the TOF of the other via. Based at least in part on the dielectric constant, a density of the material in the modified region 308 may be determined, such that the material in the modified region includes the dielectric constant. Then, a number of air gaps may be determined according to the density.

After the air gaps to be included in the modified region 308 is determined, a design of the semiconductor device 300 may be verified against mechanical properties limits of the semiconductor device 300. For example, the modified region 308 may have a lower mechanical properties limit (e.g., mechanical strength and/or thermal limits), indicating that the modified region 308 may not be a crucial structural region of the semiconductor device 300. In other words, the modified region 308 may be structurally weaker than the unmodified regions 306 and 307 without compromising the structural integrity of the semiconductor device 300. In other examples, the modified region 308 may be determined to be structurally important. Then, a new path may be determined for at least the via 304*c*, and a new region about the via 304*c* may be determined, within which the dielectric constant may be reduced.

The other vias 304*a-b* and 304*d-e* may have a different requirement than that of the via 304*c*. In some embodiments, the other vias 304*a-b* and 304*d-e* may perform acceptably without modifying material within the unmodified regions 306 and 307. In other embodiments, the unmodified regions 306 and 307 may also include air gaps, altering the dielectric constant of the unmodified regions 306 and 307. The unmodified regions 306 and 307 may include the same dielectric constant or different dielectric constants.

The design process may continue iteratively until all vias and corresponding regions with reduced dielectric constants are identified and verified against the mechanical properties limits of the semiconductor device 300. Furthermore, the design process may be "context aware," taking into account the required dielectric constant of other structures around the modified region 308, For example, a second semiconductor device may be placed atop the semiconductor device 300 (in relation to FIG. 3, out of the page). A region of the second semiconductor device directly above the modified region 308 may require a higher dielectric constant than that of the modified region 308. The modified region 308 may therefore be as shallow as possible such that the dielectric constant of within the second semiconductor device meets the required dielectric constant. In other words, the modified region 308 may be configured not only with respect to requirements of the structures within the modified region 308, but of the package as a whole.

Figure 4:
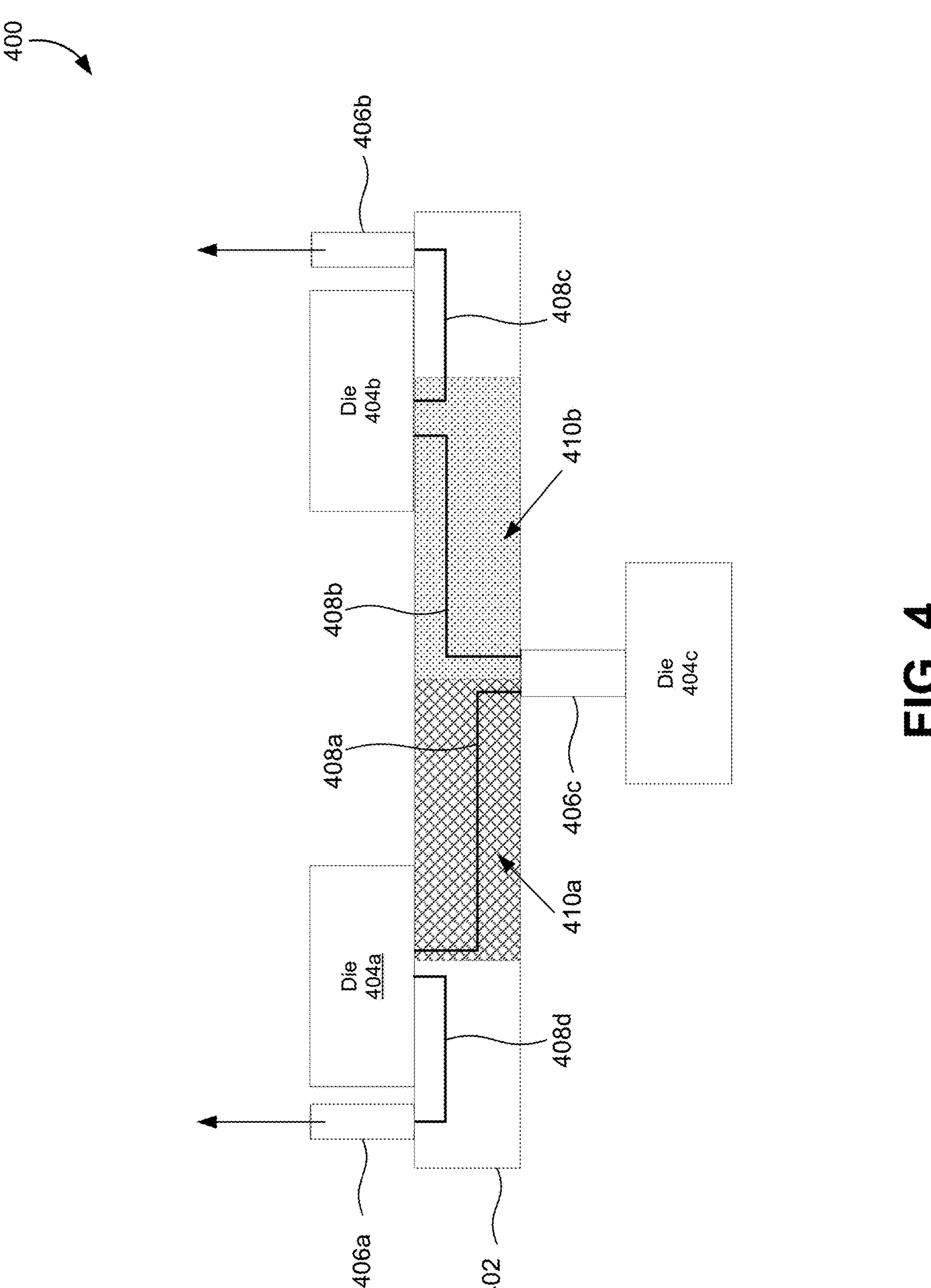
FIG. 4 illustrates a semiconductor device with a modified region, according to certain embodiments.

FIG. 4 illustrates a semiconductor device 400 with a modified region 410, according to certain embodiments. The semiconductor device 400 may be similar to the package 204-1 in FIG. 2, and include similar features and functionality. The semiconductor device 400 may include a redistribution layer (RDL) 402, dies 404*a-c*, pillars 406*a-c*, and vias 408*a-d*. Each of the dies 404*a-c* may include a chip (e.g., the chip 302 in FIG. 3) or other semiconductor device on a multichip module or package. The RDL 402 may be a layer that distributes signals from the chips of one layer to those of another layer. For example, a first signal may be transmitted from the die 404*c* through the pillar 406*c*. The signal may then be propagated through the RDL 402 using the via 408*a* to the die 404*a*. The first signal may then be transmitted through the RDL 402 using the via 408*d* from the die 404*a* to some other die using the pillar 406*a*. A second signal may be transmitted from the die 404*c* to the die 404*b* using the pillar 406*c* and the via 408*b* (in the RDL 402). The second signal may then be transmitted from the die 404*b* to another die using the via 408*c* and the pillar 406*b*.

The semiconductor device 400 may be designed in a context-aware manner, as is described above in relation to FIG. 3. During the design process, the via 408*a* may be identified as requiring a lower dielectric constant than that of the material used to construct the RDL 402. For example, the via 408*a* may be used in conjunction with another via (not shown) for differential signaling. The system requirements of a plurality of structures comprised on the semiconductor device 400 may be used to identify a three-dimensional region about the via 408*a*. The dielectric constant of the material around the via 408*a* may then be reduced in order to match the TOF of the signal to the via 408*a* to the TOF of a signal in the other via. To do so, a region 410*a* may be configured to include air gaps within the region 410*a*, such that the dielectric constant of the material within the region 410*a* is reduced. The via 408*d*, by contrast, may follow a path determined using the dielectric constant of the RDL 402. Thus, the region 410*a* may only extend towards the via 408*d* such that the dielectric constant of the region 410*a* meets the required value, and the dielectric constant around the via 408*d* is unchanged. By contrast, a region 410*b* may extend to include some or all of the via 408*c*. This may be because the dielectric constant of the material around via 408*c* is unimportant (e.g., the via 408*c* is connected to ground).

FIGS. 5A-5D illustrate a process flow for manufacturing a semiconductor device 500 with a selectively reduced dielectric constant, according to certain embodiments. In FIG. 5A, the semiconductor device 500 may include a substrate 502 and a dielectric layer 504. The substrate may be a polycrystalline substrate including materials such as silicon, silicon dioxide, aluminum oxide, sapphire, germanium, gallium arsenide, and other such materials. The dielectric layer 504 may include an n-PSPI such as SU8, Acrylates, and/or other resin systems. The dielectric layer 504 may be characterized, at least in part, by a dielectric constant. The dielectric material may be deposited onto the substrate 502 via spin coating or any other suitable method.

At FIG. 5B, a mask may be applied to dielectric layer 504 according to a deposition plan. The deposition plan may include a via 506 and air gaps 508*a*. The via 506 may be identified during a design process as requiring a lower dielectric constant (e.g., in order to match a TOF during differential signaling). In order to achieve the lower dielectric constant, a number of the air gaps 508*a-d* may be determined such that the density of the dielectric layer 504 is reduced. The dielectric constant of the dielectric layer may be selectively tuned such that only the via 506 is affected. For example, the semiconductor device 500 may be an RDL similar to the RDL 402 in FIG. 4. The via 506 may then correspond to the via 408*a* and require the lower dielectric constant, where the via 408*d* requires the dielectric constant of the dielectric layer 504.

Although the air gaps 508*a-d* are shown in two dimensions, the air gaps 508*a-d* may be arranged three-dimensionally about the via 506 and include three-dimensional shapes and/or lattices. For example, the air gaps 508*a-d* may be cubic, pyramidic, hexahedral, octahedral, pentahedral, or any other such three dimensional shape. The air gaps 508*a-d* may be on a scale of 100 nm-1 micrometer, inclusive. One of ordinary skill in the art would recognize many different possibilities and configurations.

At FIG. 5C, the dielectric layer 504 may be exposed to light during a lithography process (e.g., 2-photon lithography). As a result of being exposed to light radiation, the material of the dielectric layer 504 may insoluble to photoresist developer applied to the dielectric layer 504 after being exposed. Thus, when the photoresist developer is applied to the dielectric layer 504, the via 506 and the air gaps 508*a-d* may form hollow spaces within the dielectric layer 504. Then, at FIG. 5D, the via 506 may be filled with a metal, forming a metal-filled pathway. The metal may be a copper-containing substance, such as copper (deposited through a damascene process) or another suitable metal.

The resulting semiconductor device 500 may therefore include the substrate 502, the dielectric layer 504, and the metallic via 506. The dielectric layer 504 may include a first region including the air gaps 508*a-d*, and a second region characterized by a lack of any air gaps. The second region may be adjacent to the first region. The dielectric constant of the first region may therefore be lower than the dielectric constant of the second region. In some embodiments, the second region may also include air gaps. The second region may include more air gaps (resulting in an even lower dielectric constant), or less air gaps (resulting in a higher dielectric constant than the first region). The second region may also include a second via, where the dielectric constant of the second region modifies the signal integrity of the second via.

The specific path of the via 506 may be determined, at least in part, according to length-matching requirements of a corresponding via. For example, the via 506 may be used in differential signaling. The via 506 may therefore be electrically shortened by reducing the dielectric constant of the material surrounding the via 506. The second via in the second region, as above, may also be used in differential signaling. The dielectric constant of the second region may be configured to modify the signal integrity of the second via to correspond to a signal integrity of the via 506.

Figure 6:
FIG. 6 illustrates a method of selectively reducing a dielectric constant of a semiconductor device, according to certain embodiments.
Figure 6:
Figure 6:
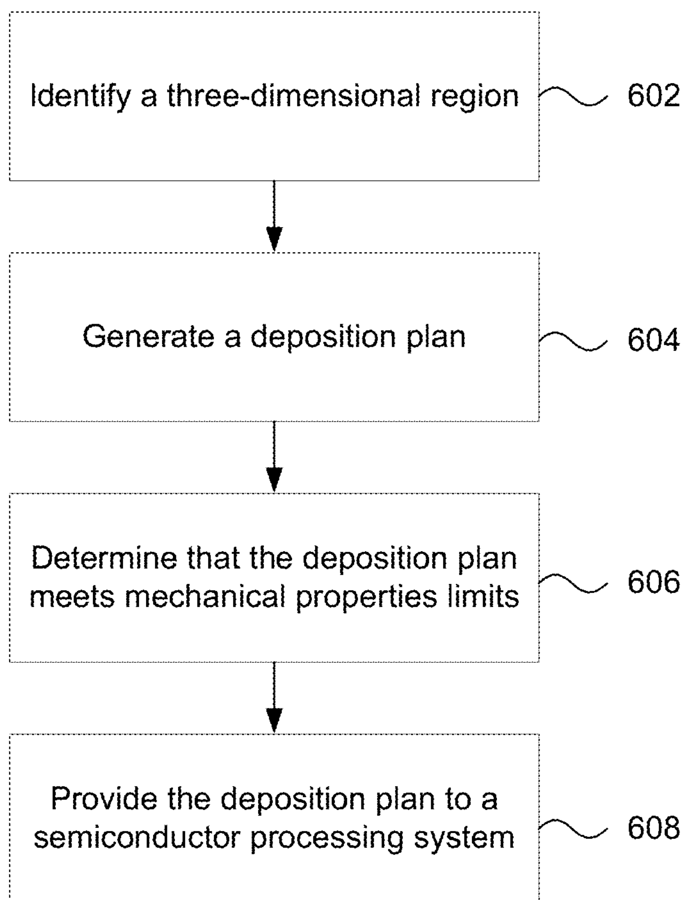

FIG. 6 illustrates a method 600 of selectively reducing a dielectric constant of a semiconductor device, according to certain embodiments. The method 600 may be performed by the systems described herein (e.g., the system 100 in FIG. 1) to manufacture some or all of the devices described (e.g., the semiconductor devices 300 and 400 in FIGS. 3 and 4.) Some of the steps of the method 600 may be performed in a different order than is described, or may be skipped altogether. In some embodiments, some steps of the method 600 may be skipped altogether.

At step 602, the method 600 may include identifying, by a computing device, a three-dimensional region of a semiconductor device (e.g., an advanced packaging device such as the package 204-1 in FIG. 2) where a pathway may be formed (e.g., the via 304*c* in FIG. 3). The material used to manufacture the semiconductor device may include a dielectric constant. A desired signal integrity of the pathway may require a lower dielectric constant than that of the material. For example, the pathway may be a via used in differential signaling (e.g., the via 506 in FIG. 5). The lower dielectric constant may electrically shorten the TOF of a signal in the via, such that the signal corresponds to a second signal in another via.

At step 604, the method 600 may include generating, by the computing device, a deposition plan characterized by air gaps formed in the three-dimensional region where the pathway may be formed. The air gaps may lower a density of the material within the three-dimensional region, thereby reducing the dielectric constant of the material. The air gaps may be any three-dimensional shape or lattice, as is described in relation to FIG. 5. The deposition plan may also be generated, at least in part, by calculating a total capacitance of the three-dimensional region including the air gaps.

The deposition plan may be generated in a context-aware manner, such as a chip package interaction analysis. In other words, the requirements of a region above, below, and/or adjacent to the three-dimensional region nay be considered during a design process to generate the deposition plan. For example, if the region above the three-dimensional region requires a dielectric constant substantially equal to that of the material used to construct the semiconductor device, the deposition plan may limit the three-dimensional region. By limiting the three-dimensional region, the dielectric constant of the region above may be substantially equal to that of the material used to construct the semiconductor device.

At step 606, the method 600 may include determining, by the computing device, that the deposition plan at least meets mechanical properties limits associated with the three-dimensional region of the semiconductor device. The mechanical properties limits may include mechanical strength, thermal tolerances, and other such properties. The mechanical properties limits may also be determined in a context-aware manner. In other words, the mechanical properties of the three-dimensional region may be analyzed to determine the effect of the mechanical properties on the semiconductor device as a whole. For example, the mechanical properties limits may be used to determine if the three-dimensional region including the air gaps may lead to mechanical failure of the semiconductor device and/or thermal failure (e.g., during the manufacturing process).

In response to determining that the deposition plan at least meets the mechanical properties limits associated with the three-dimensional region of the semiconductor device, at step 608, the method 600 may include providing, by the computing device, the deposition plan to a semiconductor processing system (e.g., the system 100 in FIG. 1), such that the semiconductor processing system executes the deposition plan. The semiconductor device may then be formed by the semiconductor processing system such that the semiconductor device includes the pathway through the three-dimensional region. The three-dimensional region may be characterized by the lower dielectric constant such that the desired signal integrity is achieved.

In some embodiments, the pathway may be formed using a copper damascene process. For example, the semiconductor device may be formed by developing an n-PSPI material on a substrate. Developing the n-PSPI material may form cavities for the air gaps and/or the pathway. After the n-PSPI material is developed, the pathway may be filled with a metal, such as cooper, via a damascene process.

Each of the methods (e.g., the method 600), described herein may be implemented by a computer system. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 7:
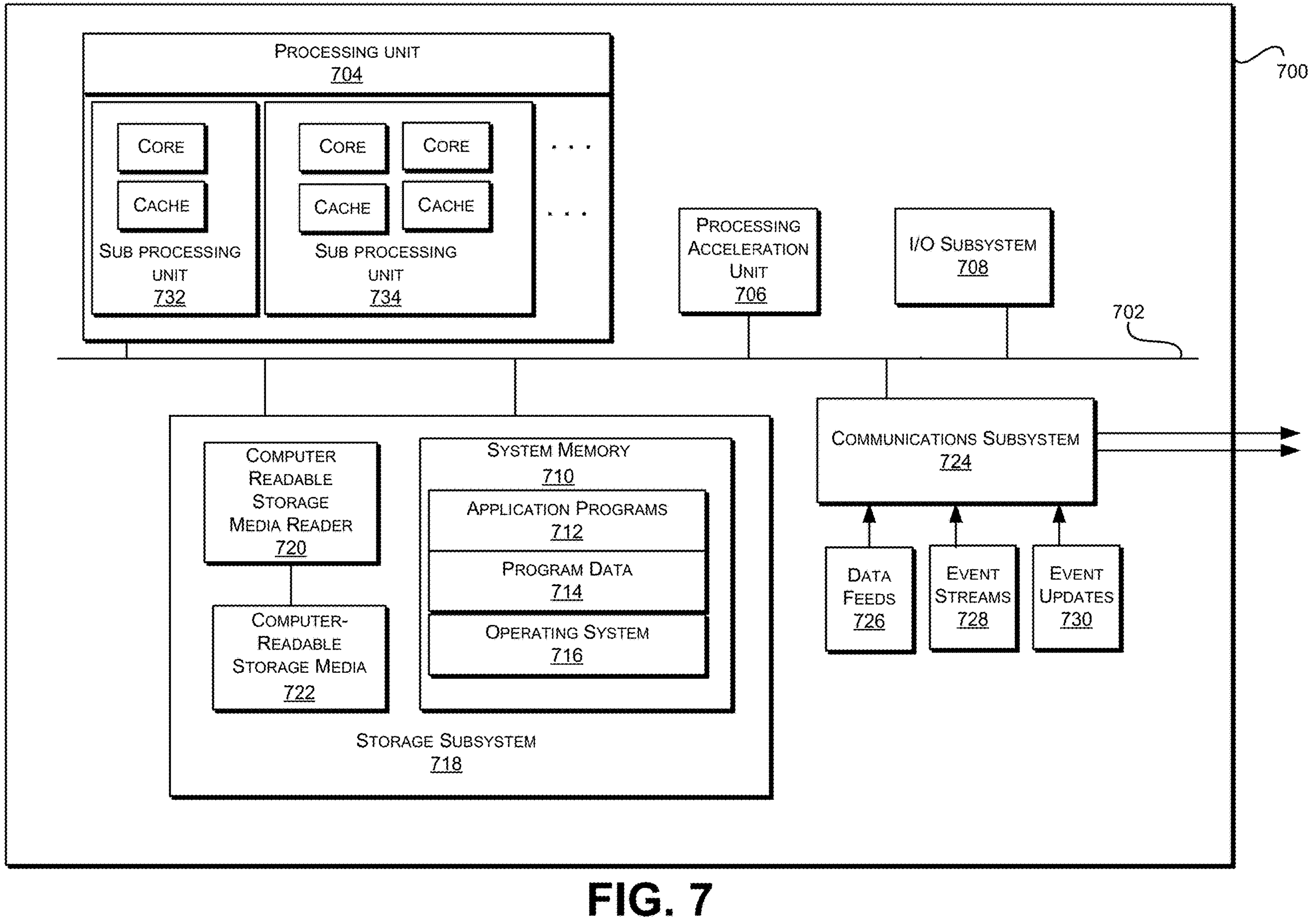
FIG. 7 illustrates an exemplary computer system, in which various embodiments may be implemented.

FIG. 7 illustrates an exemplary computer system 700, in which various embodiments may be implemented. The system 700 may be used to implement any of the computer systems described above. As shown in the figure, computer system 700 includes a processing unit 704 that communicates with a number of peripheral subsystems via a bus subsystem 702. These peripheral subsystems may include a processing acceleration unit 706, an I/O subsystem 708, a storage subsystem 718 and a communications subsystem 724. Storage subsystem 718 includes tangible computer-readable storage media 722 and a system memory 710.

Bus subsystem 702 provides a mechanism for letting the various components and subsystems of computer system 700 communicate with each other as intended. Although bus subsystem 702 is shown schematically as a single bus, alternative embodiments of the bus subsystem may utilize multiple buses. Bus subsystem 702 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 704, which can be implemented as one or more integrated circuits (e.g., a conventional microprocessor or microcontroller), controls the operation of computer system 700. One or more processors may be included in processing unit 704. These processors may include single core or multicore processors. In certain embodiments, processing unit 704 may be implemented as one or more independent processing units 732 and/or 734 with single or multicore processors included in each processing unit. In other embodiments, processing unit 704 may also be implemented as a quad-core processing unit formed by integrating two dual-core processors into a single chip.

In various embodiments, processing unit 704 can execute a variety of programs in response to program code and can maintain multiple concurrently executing programs or processes. At any given time, some or all of the program code to be executed can be resident in processor(s) 704 and/or in storage subsystem 718. Through suitable programming, processor(s) 704 can provide various functionalities described above. Computer system 700 may additionally include a processing acceleration unit 706, which can include a digital signal processor (DSP), a special-purpose processor, and/or the like.

I/O subsystem 708 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices, sensors that enable users to control and interact with an input device, through a natural user interface using gestures and spoken commands. User interface input devices may also include eye gesture recognition devices that detect eye activity (e.g., 'blinking' while taking pictures and/or making a menu selection) from users and transforms the eye gestures as input into an input device. Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 700 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 700 may comprise a storage subsystem 718 that comprises software elements, shown as being currently located within a system memory 710. System memory 710 may store program instructions that are loadable and executable on processing unit 704, as well as data generated during the execution of these programs.

Depending on the configuration and type of computer system 700, system memory 710 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 704. In some implementations, system memory 710 may include multiple different types of memory, such as static random access memory (SRAM) or dynamic random access memory (DRAM). In some implementations, a basic input/output system (BIOS), containing the basic routines that help to transfer information between elements within computer system 700, such as during start-up, may typically be stored in the ROM. By way of example, and not limitation, system memory 710 also illustrates application programs 712, which may include client applications, Web browsers, mid-tier applications, relational database management systems (RDBMS), etc., program data 714, and an operating system 716.

Storage subsystem 718 may also provide a tangible computer-readable storage medium for storing the basic programming and data constructs that provide the functionality of some embodiments. Software (programs, code modules, instructions) that when executed by a processor provide the functionality described above may be stored in storage subsystem 718. These software modules or instructions may be executed by processing unit 704. Storage subsystem 718 may also provide a repository for storing data used in accordance with some embodiments.

Storage subsystem 718 may also include a computer-readable storage media reader 720 that can further be connected to computer-readable storage media 722. Together (and optionally), in combination with system memory 710, computer-readable storage media 722 may comprehensively represent remote, local, fixed, and/or removable storage devices plus storage media for temporarily and/or more permanently containing, storing, transmitting, and retrieving computer-readable information.

Computer-readable storage media 722 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 700.

By way of example, computer-readable storage media 722 may include a hard disk drive that reads from or writes to non-removable, nonvolatile magnetic media, a magnetic disk drive that reads from or writes to a removable, nonvolatile magnetic disk, and an optical disk drive that reads from or writes to a removable, nonvolatile optical disk such as a CD ROM, DVD, or other optical media. Computer-readable storage media 722 may include, but is not limited to flash memory cards, universal serial bus (USB) flash drives, secure digital (SD) cards, DVD disks, digital video tape, and the like. Computer-readable storage media 722 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 700.

Communications subsystem 724 provides an interface to other computer systems and networks. Communications subsystem 724 serves as an interface for receiving data from and transmitting data to other systems from computer system 700. For example, communications subsystem 724 may enable computer system 700 to connect to one or more devices via the Internet. In some embodiments communications subsystem 724 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 724 can provide wired network connectivity (e.g., Ethernet) in addition to or instead of a wireless interface.

In some embodiments, communications subsystem 724 may also receive input communication in the form of structured and/or unstructured data feeds 726, event streams 728, event updates 730, and the like on behalf of one or more users who may use computer system 700.

By way of example, communications subsystem 724 may be configured to receive data feeds 726 in real-time from users of social networks and/or other communication services, web feeds such as Rich Site Summary (RSS) feeds, and/or real-time updates from one or more third party information sources.

Additionally, communications subsystem 724 may also be configured to receive data in the form of continuous data streams, which may include event streams 728 of real-time events and/or event updates 730, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 724 may also be configured to output the structured and/or unstructured data feeds 726, event streams 728, event updates 730, and the like to one or more databases that may be in communication with one or more streaming data source computers coupled to computer system 700. Computer system 700 can be one of various types, including a handheld portable device, a wearable device, a PC, a workstation, a mainframe, a kiosk, a server rack, or any other data processing system.

Due to the ever-changing nature of computers and networks, the description of computer system 1000 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMS, EPROMS, EEPROMs, magnetic or optical cards, flash memory, or other types of machine-readable mediums suitable for storing electronic instructions. Alternatively, the methods may be performed by a combination of hardware and software.

What is claimed is:

1. A method of constructing a redistribution layer of a semiconductor device, the method comprising:

identifying, by a computing device, a three-dimensional region of the semiconductor device where a pathway may be formed, wherein a material to be used to manufacture the semiconductor device comprises a dielectric constant, and a desired signal integrity along the pathway requires a lower dielectric constant;

generating, by the computing device, a deposition plan characterized by air gaps formed in the three-dimensional region of the semiconductor device where the pathway may be formed;

determining, by the computing device, that the deposition plan at least meets mechanical properties limits associated with the three-dimensional region of the semiconductor device; and in response to determining that the deposition plan at least meets the mechanical properties limits associated with the three-dimensional region of the semiconductor device:

providing, by the computing device, the deposition plan to a semiconductor processing system such that the semiconductor processing system executes the deposition plan and forms the semiconductor device comprising the pathway through the three-dimensional region, the three-dimensional region characterized by the lower dielectric constant such that the desired signal integrity is achieved.

2. The method of claim 1, wherein the semiconductor processing system is configured to produce a semiconductor device using 2-photon lithography.

3. The method of claim 1, wherein the semiconductor device comprises an advanced packaging device.

4. The method of claim 1, wherein the pathway is formed using a copper damascene process.

5. The method of claim 1, wherein the air gaps of the three-dimensional region and the material of the three-dimensional region form a lattice pattern characterized by at least one of cubic air gaps, hexagonally prismatic air gaps, and pyramidic air gaps.

6. The method of claim 1, wherein the mechanical properties of the three-dimensional region are determined at least in part by a required mechanical strength of the three-dimensional region.

7. The method of claim 1, wherein the mechanical properties of the three-dimensional region comprise a thermal tolerance of the three-dimensional region.

8. The method of claim 1, wherein the three-dimensional region is identified at least in part by determining properties of a second semiconductor device to be formed above the three-dimensional region and determining properties of a third semiconductor device to be formed below the three-dimensional region.

9. The method of claim 1, wherein the deposition plan is generated in part by calculating a total capacitance of the three-dimensional region comprising the air gaps.

10. The method of claim 1, further comprising determining a region adjacent to the three-dimensional region of the semiconductor device, the region characterized by a lack of airgaps.

11. The method of claim 1, further comprising determining a position of the metallic pathway according to length-matching requirements associated with a corresponding metallic pathway.

12. The method of claim 1, further comprising:

identifying a second metallic pathway; and identifying a second region about the second metallic pathway comprising a second plurality of air gaps within the dielectric material and arranged three-dimensionally throughout the second region, wherein the second plurality of air gaps are configured such that a dielectric constant of the second region modifies a signal integrity of the second metallic pathway to correspond to a signal integrity of the metallic pathway.

13. The method of claim 1, wherein the semiconductor device comprises a redistribution layer.

14. The method of claim 1, wherein each air gap of the plurality of air gaps comprises dimensions within a range of 100 nanometers to 1 micrometer, inclusive.

15. A system comprising:

a semiconductor processing chamber, configured to receive a substrate;

a lithography tool configured to perform 2-photon lithography; and a computing device comprising:

one or more processors; and a non-transitory computer-readable medium comprising instructions, that, when executed by the one or more processors, cause the computing device to perform operations to:

identify a three-dimensional region of a semiconductor device where a pathway may be formed, wherein a material to be used to manufacture the semiconductor device comprises a dielectric constant and a desired signal integrity along the pathway requires a lower dielectric constant;

generate a deposition plan characterized by air gaps formed in the three-dimensional region of the semiconductor device where the pathway may be formed;

determine that the deposition plan at least meets mechanical properties limits associated with the three-dimensional region of the semiconductor device; and in response to determining that the deposition plan at least meets the mechanical properties limits associated with the three-dimensional region of the semiconductor device:

provide the deposition plan to a semiconductor processing system such that the semiconductor processing system executes the deposition plan and forms the semiconductor device comprising the pathway through the three-dimensional region, the three-dimensional region characterized by the lower dielectric constant such that the desired signal integrity is achieved.

16. The system of claim 15, wherein the deposition plan is generated, at least in part using a chip package interaction analysis.

17. The system of claim 15, wherein the identifying the three-dimensional region includes a context-aware analysis, wherein system requirements of a plurality of structures comprised on the semiconductor device are used to identify the three-dimensional region.

18. The system of claim 17, wherein the context aware analysis includes determining properties of a second semiconductor device to be formed above the three-dimensional region and determining properties of a third semiconductor device to be formed below the three-dimensional region.

19. The system of claim 15, wherein the air gaps of the three-dimensional region and the material of the region form a lattice pattern characterized by at least one of cubic air gaps, hexagonally prismatic air gaps, and pyramidic air gaps.

* * * * *